(12) United States Patent　　(10) Patent No.:　US 12,617,305 B2

Andruskiewicz, IV et al.　　(45) Date of Patent:　　May 5, 2026

(54) CHARGE PORT COOLING SYSTEM FOR AN ELECTRIC VEHICLE

(71) Applicant: GM Global Technology Operations LLC, Detroit, MI (US)

(72) Inventors: Peter Paul Andruskiewicz, IV, Ann Arbor, MI (US); Chih-hung Yen, Bloomfield Hills, MI (US); Satish P. Ketkar, Troy, MI (US); SeungHwan Keum, Northville, MI (US); Taeyoung Han, Troy, MI (US); Vicente Domenech Llopis, Rochester Hills, MI (US); Orlando Saenz Fuentes, St. Clair Shores, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 769 days.

(21) Appl. No.: 17/968,979

(22) Filed: Oct. 19, 2022

(65) Prior Publication Data

US 2024/0131940 A1　　Apr. 25, 2024
US 2024/0227592 A9　　Jul. 11, 2024

(51) Int. Cl.
B60L 53/302　　(2019.01)
B60L 53/16　　(2019.01)
H05K 7/20　　(2006.01)

(52) U.S. Cl.
CPC ............. B60L 53/302 (2019.02); B60L 53/16 (2019.02); H05K 7/20327 (2013.01); H05K 7/20409 (2013.01); H05K 7/20509 (2013.01)

(58) Field of Classification Search
CPC .... B60L 53/302; B60L 53/16; B60L 2240/36; H05K 7/20327; H05K 7/20409; H05K 7/20509; H05K 7/2029
See application file for complete search history.

(56) References Cited

U.S. PATENT DOCUMENTS

| | | | | |
|---|---|---|---|---|
| 10,330,393 B2 * | 6/2019 | France | ................. | F28D 20/026 |
| 10,618,418 B2 * | 4/2020 | Turik | .................... | H01R 24/28 |
| 12,119,146 B2 * | 10/2024 | Shabgard | ............ | F28D 15/0275 |
| 2021/0347270 A1 * | 11/2021 | Cole | ....................... | B60L 53/16 |

FOREIGN PATENT DOCUMENTS

| | | | | | |
|---|---|---|---|---|---|
| CN | 102434968 A | * | 5/2012 | .......... | F24H 3/0447 |
| CN | 206903768 U | * | 1/2018 | | |
| CN | 114389085 A | * | 4/2022 | .......... | H01R 13/502 |
| DE | 202020003799 U1 | * | 12/2020 | ............ | B60L 53/302 |

OTHER PUBLICATIONS

CN-114389085-A English Translation (Year: 2022).*
DE-202020003799-U1 English Translation (Year: 2020).*
CN-102434968-A English Translation (Year: 2012).*
CN-206903768-U English Translation (Year: 2018).*

* cited by examiner

*Primary Examiner* — Michael T. Walsh

(74) *Attorney, Agent, or Firm* — CANTOR COLBURN LLP

(57)　　　ABSTRACT

A cooling system for an electric vehicle charge port includes a member having a base wall including an opening and a perimetrical wall extending from the base wall. The base wall and the perimetrical wall defining a volume. A heat spreader arranged in the volume. A terminal extends from the heat spreader through the opening in the base wall. An amount of phase change material (PCM) arranged in the volume, the amount of PCM is in contact with the terminal.

20 Claims, 7 Drawing Sheets

CHARGE PORT COOLING SYSTEM FOR AN ELECTRIC VEHICLE

INTRODUCTION

The subject disclosure relates to the art of electric vehicles and, more particularly, to a charge port cooling system for an electric vehicle.

Electric vehicles include a charge port that may serve as an electrical interface with a charging station. The charging station provides electricity to charge an on-board vehicle battery. Often times, the charge port includes a sensor and an onboard control module. The sensor may communicate with the onboard control module, and the onboard control module may communicate with the charging station. For example, the sensor may take the form of a temperature sensor that detects charge port temperatures.

When charge port temperatures exceed a predetermined threshold, the onboard control module or the charging station may derate charging. That is, charging may continue at a reduced rate or may be paused to allow charge port temperatures to drop. The charge rate may be increased and/or charging may be restarted once temperatures fall below the predetermined threshold. Inhibiting a charging rate due to high charging temperatures may be inconvenient to a user. Accordingly, the industry would welcome a charge port cooling system that is not dependent on liquid cooling techniques.

SUMMARY

A cooling system for an electric vehicle charge port, in accordance with a non-limiting example, includes a member having a base wall including an opening and a perimetrical wall extending from the base wall. The base wall and the perimetrical wall define a volume. A heat spreader is arranged in the volume. A terminal extends from the heat spreader through the opening in the base wall. An amount of phase change material (PCM) is arranged in the volume.

In addition to one or more of the features described herein the heat spreader extends from the terminal to the perimetrical wall.

In addition to one or more of the features described herein the heat spreader comprises a metallic foam.

In addition to one or more of the features described herein the metallic foam is an open cell metallic foam.

In addition to one or more of the features described herein the heat spreader includes a plurality of fins that project radially outwardly from the terminal.

In addition to one or more of the features described herein the heat spreader includes a central support including a bore receptive of the terminal, the plurality of fins being formed with the central support.

In addition to one or more of the features described herein the perimetrical wall is annular.

In addition to one or more of the features described herein the member is formed from a heat-shrink rubber material.

In addition to one or more of the features described herein the base wall includes a first opening and a second opening, the member including a divider that extends between the first opening and the second opening dividing the volume into a first portion and a second portion.

In addition to one or more of the features described herein the terminal includes a first terminal extending into the first portion of the volume through the first opening in the base wall and a second terminal extending into the second portion of the volume through the second opening in the base wall.

A vehicle, in accordance with a non-limiting example, includes a body, an electric motor arranged in the body, a battery pack electrically connected to the electric motor, and a charge port supported by the body and electrically connected to the battery pack. The charge port includes a member having a base wall including an opening and a perimetrical wall extending from the base wall. The base wall and the perimetrical wall define a volume. A heat spreader is arranged in the volume. A terminal extends from the heat spreader through the opening in the base wall. An amount of phase change material (PCM) is arranged in the volume.

In addition to one or more of the features described herein the heat spreader extends from the terminal to the perimetrical wall.

In addition to one or more of the features described herein the heat spreader comprises a metallic foam.

In addition to one or more of the features described herein the metallic foam is an open cell metallic foam.

In addition to one or more of the features described herein the heat spreader includes a plurality of fins that project radially outwardly from the terminal.

In addition to one or more of the features described herein the heat spreader includes a central support including a bore receptive of the terminal, the plurality of fins being formed with the central support.

In addition to one or more of the features described herein the perimetrical wall is annular.

In addition to one or more of the features described herein the member is formed from a heat-shrink rubber material.

In addition to one or more of the features described herein the base wall includes a first opening and a second opening, the member including a divider that extends between the first opening and the second opening dividing the volume into a first portion and a second portion.

In addition to one or more of the features described herein the terminal includes a first terminal extending into the first portion of the volume through the first opening in the base wall and a second terminal extending into the second portion of the volume through the second opening in the base wall.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
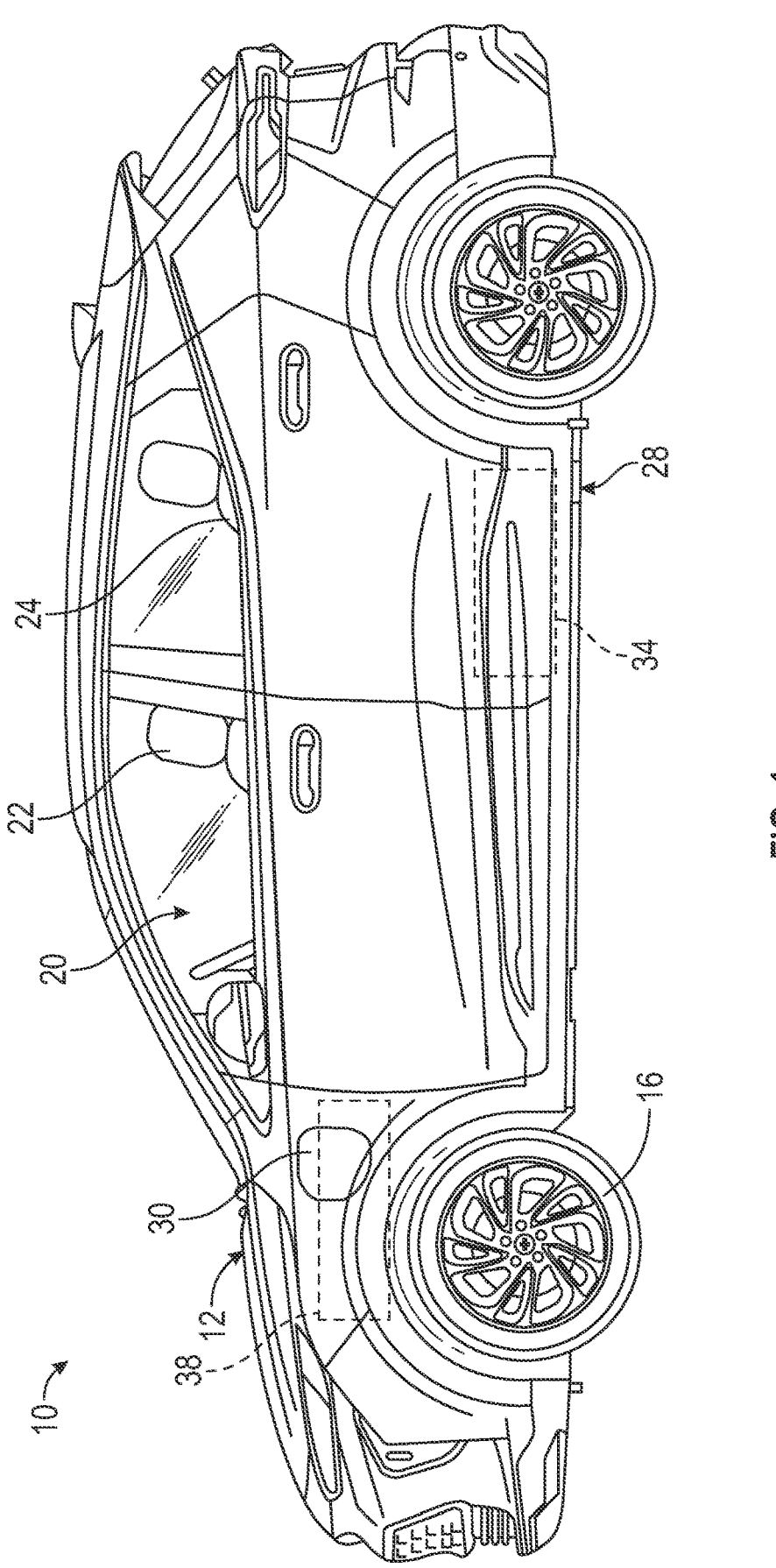
FIG. 1 is a side view of an electric vehicle including a charge port provided with a phase change material (PCM) cooling system, in accordance with a non-limiting example.

The following description is merely exemplary in nature and is not intended to limit the present disclosure, its application or uses. It should be understood that throughout the drawings, corresponding reference numerals indicate like or corresponding parts and features.

A vehicle, in accordance with a non-limiting example, is indicated generally at 10 in FIG. 1. Vehicle 10 includes a body 12 supported on a frame (not shown) and a plurality of wheels, one of which is indicated at 16. Body 12 includes a passenger compartment 20 that includes at least one driver's seat 22 and at least one rear passenger seat 24. Vehicle 10 takes the form of an electric vehicle (EV) 28 including a charge port 30. Charge port 30 serves as an interface between an external charging device (not shown) and a vehicle battery pack 34. Vehicle battery pack 34 is operatively connected to an electric motor 38 that provides motive power to vehicle 10.

Figure 2:
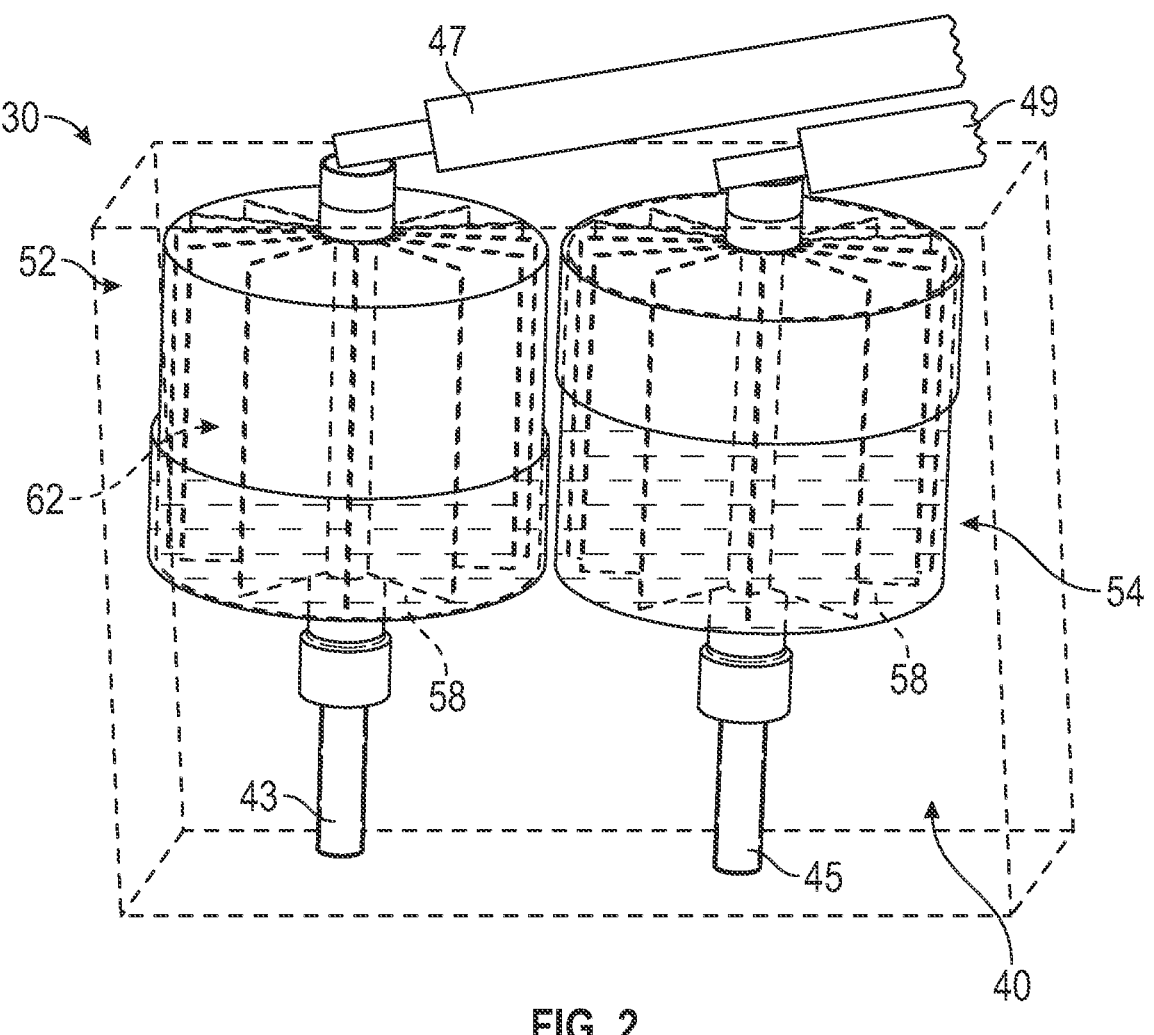
FIG. 2 is a side plan view looking down on the charge port with the PCM cooling system, in accordance with a non-limiting example.

Referring to FIG. 2, charge port 30 includes charging receptacle 40 that is receptive of a charging device (not shown) a first terminal 43 and a second terminal 45. First terminal 43 and second terminal 45 establish an electrical connection between the external charging device and vehicle battery pack 34. In a non-limiting example, first terminal 43 is connected to a first electrical conductor 47. First electrical conductor 47 is electrically connected with vehicle battery pack 34 through, for example, a charging controller (not shown). Second terminal 45 is connected to a second electrical conductor 49. Second electrical conductor 49 is electrically connected with vehicle battery pack 34 through the charging controller.

In a non-limiting example, first terminal 43 may connect with an anode (not shown) of vehicle battery pack 34 through first electrical conductor 47 and second terminal 45 may connect with a cathode (also not shown) of vehicle battery pack 34 through second electrical conductor 49. In a non-limiting example, first terminal 43 includes a first phase change material (PCM) cooling system 52 and second terminal 45 includes a second PCM cooling system 54. Reference will now continue to FIGS. 3-8 in describing first PCM cooling system 52 with an understanding that second PCM cooling system 54 includes corresponding structure.

As will be detailed herein, PCM cooling system 52 relies on an amount of PCM 58 that is warmed by ohmic heating induced by electrical flow passing through first terminal 43. That is PCM 58 absorbs that heat and, in a non-limiting example, changes phase from a solid state to a liquid state. The change in phase absorbs the heat induced by the electrical flow passing into first terminal 43 during charging, thereby providing a cooling effect.

Figure 3:
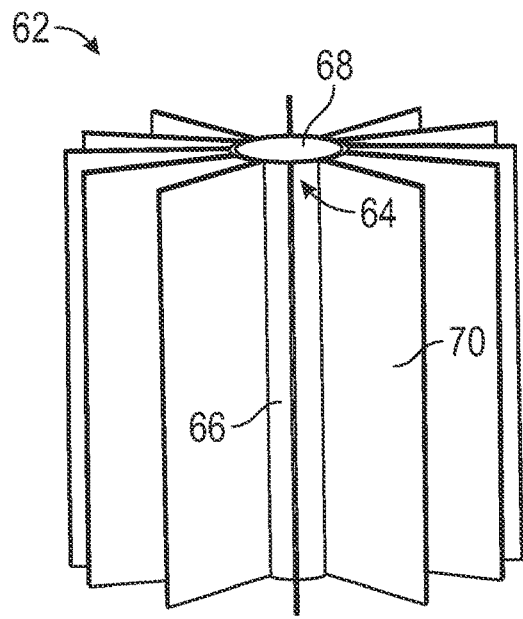
FIG. 3 is a perspective view of a heat spreader of the PCM cooling system, in accordance with a non-limiting example.
Figure 4:
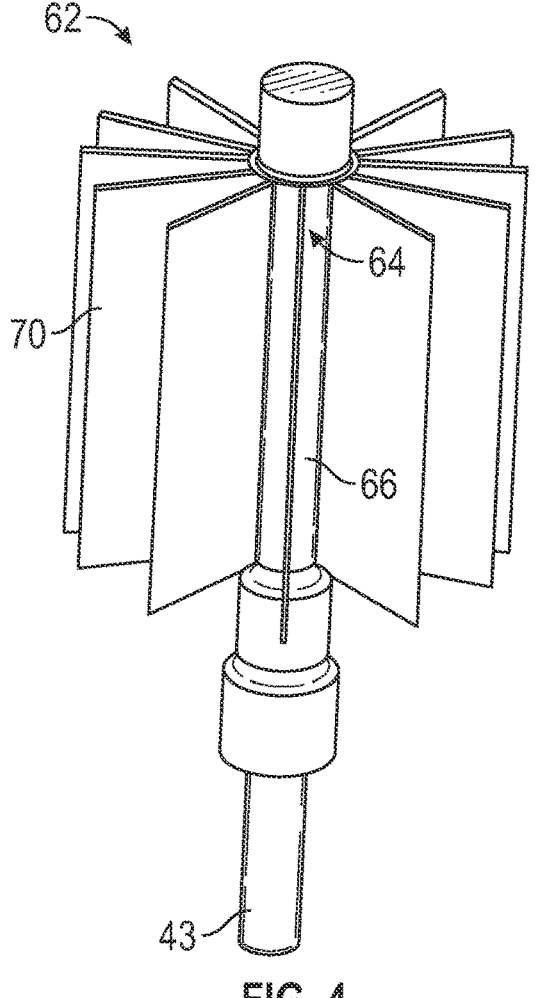
FIG. 4 is a perspective view of the heat spreader of FIG. 3 provided on a charge port terminal, in accordance with a non-limiting example.

First PCM cooling system 52 includes a heat spreader 62. As shown in FIG. 3, heat spreader 62 includes a central support 64 having an outer surface 66. Central support 64 includes a bore or passage 68. A plurality of fins 70 project radially from outer surface 66 of central support 64. As shown in FIG. 4, bore 68 is receptive of first terminal 43 such that central support 64 and first terminal 43 are in a heat exchange relationship. In this manner, plurality of fins 70 carry heat from first terminal 43 radially away from central support 64.

Figures 5, 6:
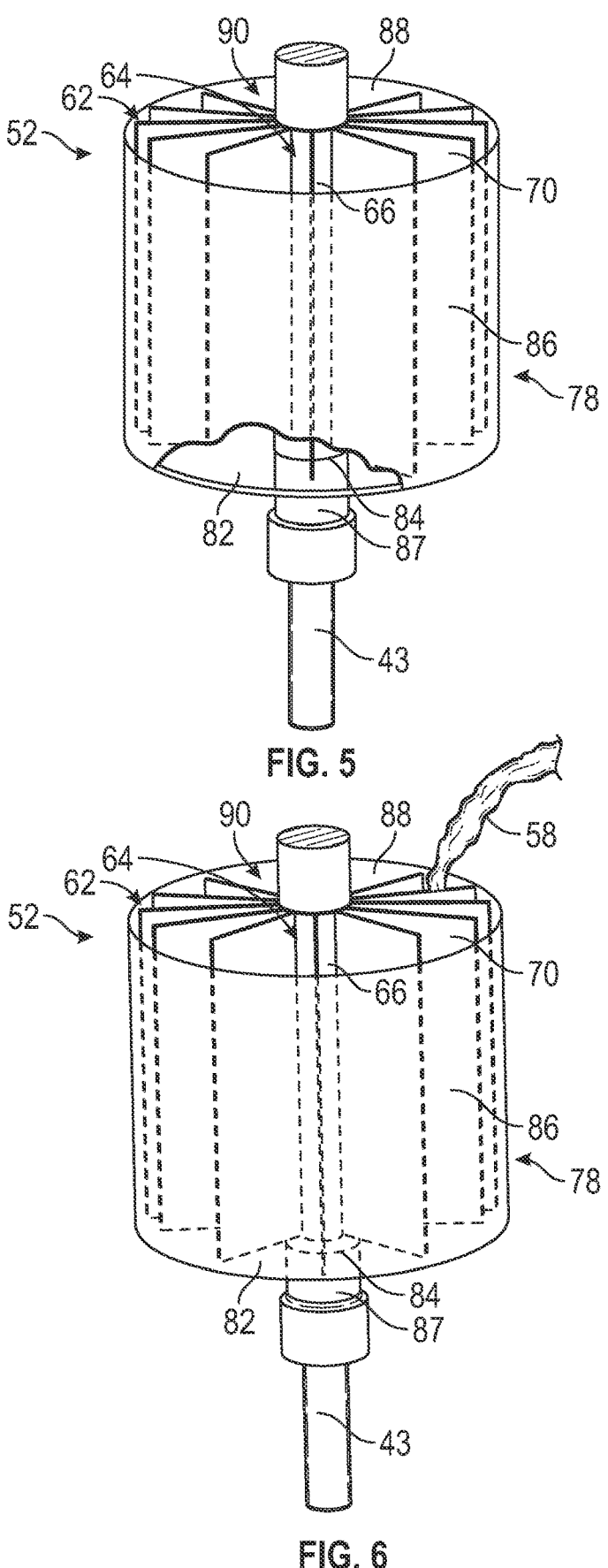
FIG. 5 is a perspective view of a member defining a volume disposed about the heat spreader of FIG. 4, in accordance with a non-limiting example.
FIG. 6 depicts a perspective view of the member of FIG. 5 with PCM being introduced into the volume.

A member 78 is arranged about heat spreader 62 as shown in FIG. 5. Member 78 possesses a frusto-conical or funnel shape such that when disposed about plurality of fins 70 forms a base wall 82 including an opening 84 receptive of first terminal 43 and a perimetrical wall 86. That is, member 78 may include a first portion 87 having a first dimension sized to receive first terminal 43. Perimetrical wall 86 includes a second dimension, that is larger than the first dimension, sized to receive heat spreader 62. Perimetrical wall 86 includes an inner surface 88. Member 78 may be formed from a an electrically insulative heat shrink material such that when heated, inner surface 88 contacts each of the plurality of fins 70 forming an open-topped volume or plurality of volumes 90 defined between adjacent fins 70.

Figures 7, 8:
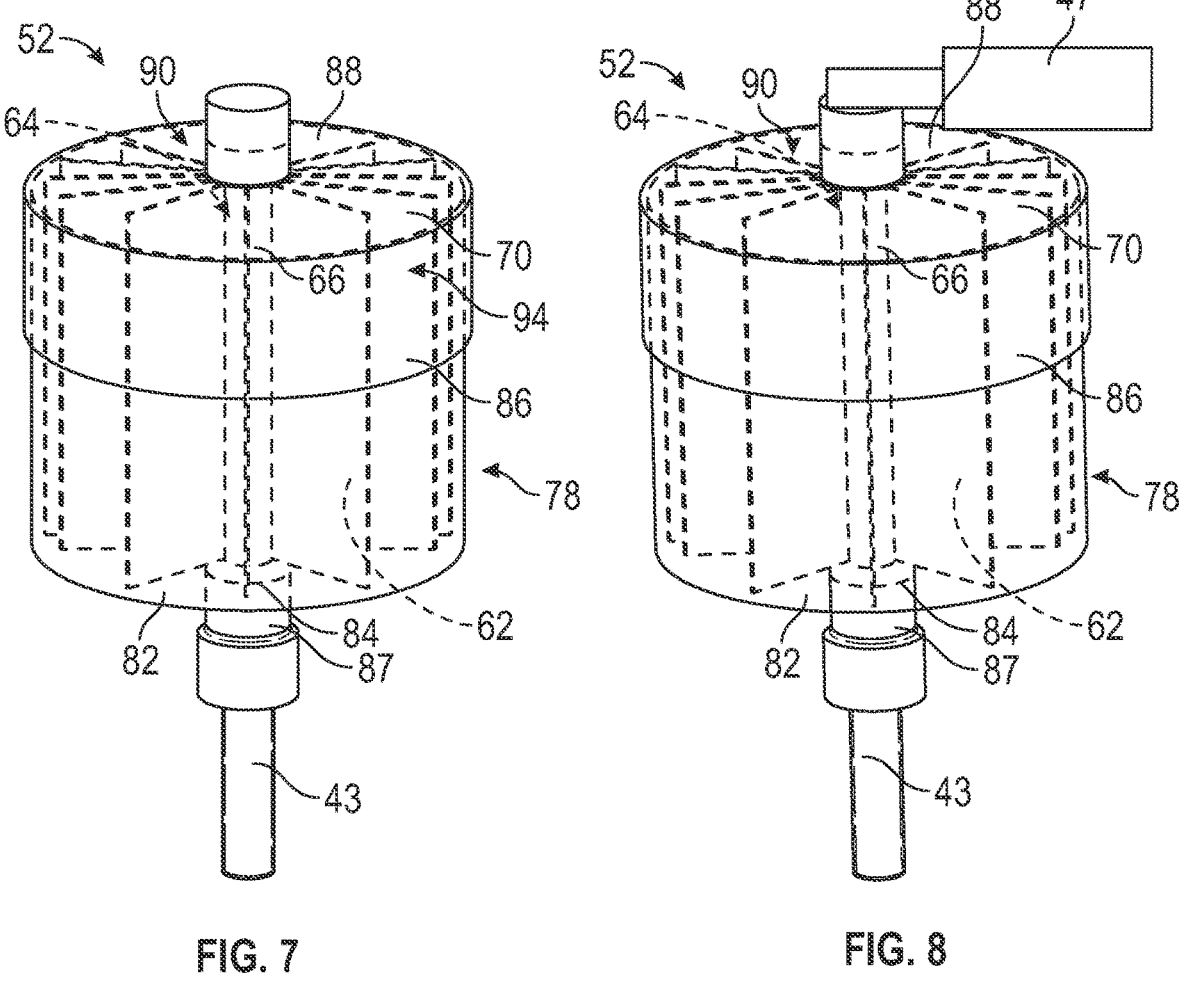
FIG. 7 depicts a perspective view of a cover installed on the member of FIG. 6, in accordance with a non-limiting example.
FIG. 8 depicts a perspective view of an electrical conductor being attached to the terminal; in accordance with a non-limiting example.

Of course, the particular shape of member 78 and the type of material used may vary. In a non-limiting example shown in FIG. 6, the amount of PCM 58 is introduced into each of the plurality of volumes 90. A cover member 94 is attached to member 78 as shown in FIG. 7 and first conductor 47 is attached as shown in FIG. 8. In a non-limiting example, cover member 94 may be formed from an electrically insulative heat shrink material that seals against and/or around member 78 to prevent leakage of PCM 58.

During charging, electrical current flows through first conductor 47 and through first terminal 43 producing heat. The heat passes into heat spreader 62 due to a thermal interface between central support 64 and first terminal 43. The heat flows radially outwardly into plurality of fins 70 and acts upon the amount of PCM 54. The amount of PCM 54 absorbs heat and begins to change state with a minimal increase in temperature. The change of state releases heat to ambient. In this manner, first terminal 43 may be maintained within a selected temperature range when vehicle 10 is charging. A similar effect is provided by second PCM cooling system 54.

Figure 9:
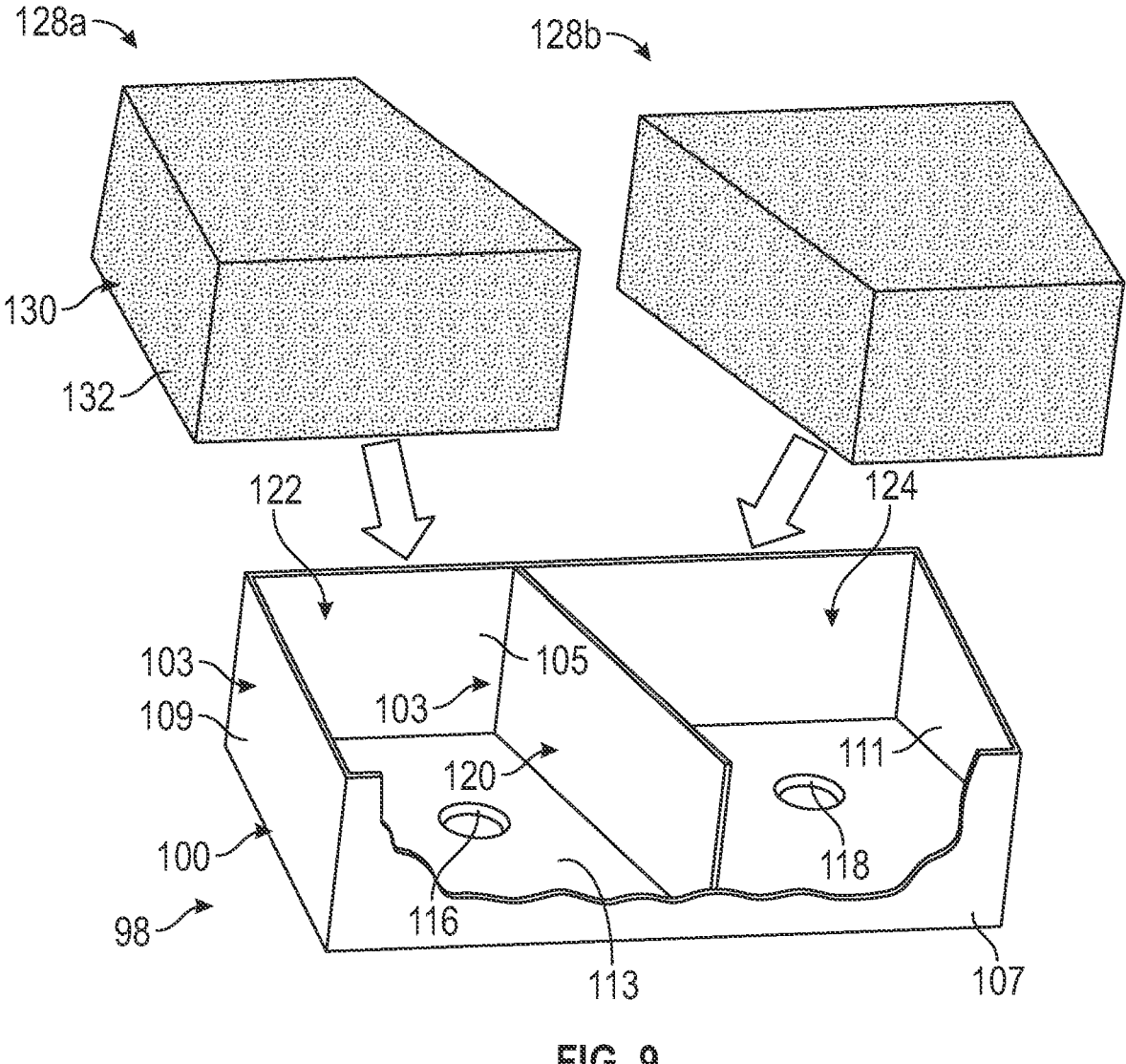
FIG. 9 depicts a partially disassembled view of a heat spreader being arranged in a charge port housing, in accordance with another non-limiting example.
Figure 10:
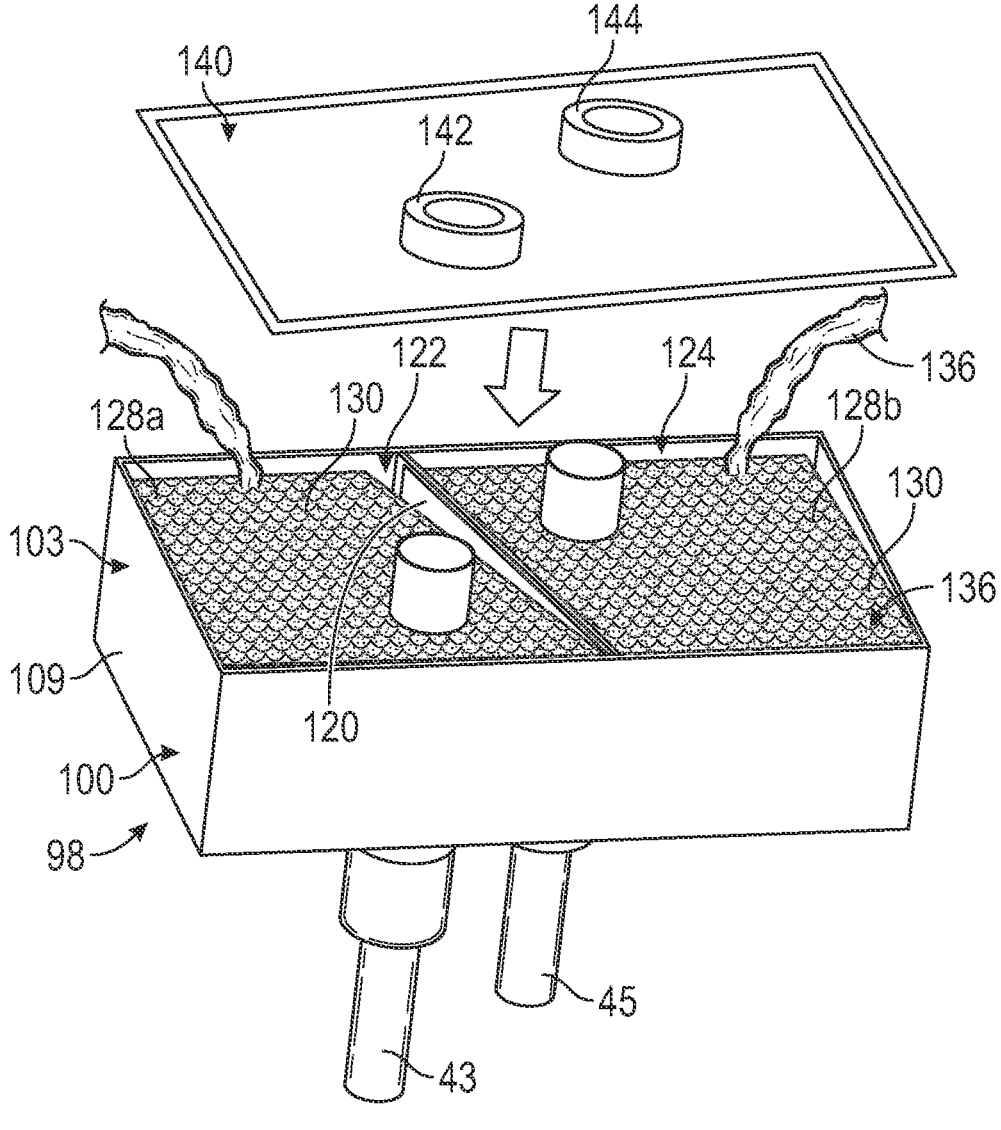
FIG. 10 depicts PCM being introduced into the charge port housing of FIG. 9, in accordance with a non-limiting example.

Reference will now follow to FIGS. 9 and 10 in describing a PCM cooling system 98 in accordance with another non-limiting example. PCM cooling system 98 includes a member 100 having a perimetrical wall 103 including a first wall portion 105, a second wall portion 107 that is opposite first wall portion 105, a third wall portion 109 extending between first wall portion 105 and second wall portion 107, and a fourth wall portion 111 opposite third wall portion 109. Member 100 is also shown to include a base wall 113 having a first opening 116 and a second opening 118. A divider 120 extends between first wall portion 105 and second wall portion 107 forming a first volume 122 including first opening 116 and a second volume 124 including second opening 118. In a non-limiting example, member 100 and divider 120 are formed from an electrically insulative material so as to prevent current flow between first and second terminals 43 and 45.

In a non-limiting example, a first heat spreader 128a is arranged in first volume 122 and a second heat spreader 128b is arranged in second volume 124. Each heat spreader 128a, 128b takes the form of a metallic foam 130. In a non-limiting example, metallic foam 130 which, may include open cell pores 132 that are fluidically interconnected so as to form an open cell metallic foam. First terminal 43 is passed through first opening 116 and second terminal 45 is passed through second opening 118. First heat spreader 128 is arranged in first volume 122 in a heat exchange contact with first terminal 43 and second heat spreader 128b is arranged in second volume 124 in heat exchange contact with second terminal 45. First and second heat spreaders 128a, 128b, may be arranged in corresponding ones of first and second volumes 122, 124 either prior to, or after the installation of first terminal 43 and second terminal 45.

Referring to FIG. 10, after first and second terminals 43 and 45, and first and second heat spreaders 128a, and 128b are arranged in corresponding ones of first volume 122 and second volume 124, an amount of PCM 136 is introduced. That is, amount of PCM 136 is introduced into metallic foam 130 until each volume 122/124 is filled to a selected level. A cover 140 may be placed onto member 100. Cover 140 may be formed from an electrically insulative material and includes a first opening portion 142 that is receptive of and seals about first terminal 43 and a second opening portion 144 that is receptive of and seals about second terminal 45. At this point, first and second conductors 47 and 49 may be attached to first and second terminals 43 and 45 respectively. At this point, it should be understood that the particular shape of member 100 may vary.

During charging, electrical current flows through first conductor 47 and second conductor 49 into first terminal 43 and second terminal 45. The current flow produces heat in each terminal 43/45. The heat passes into heat spreaders 128a and 128b respectively. The heat flows radially outwardly into heat spreaders 128a and 128b and acts upon the amount of PCM 136. The amount of PCM 136 absorbs heat and begins to change state with a minimal change in temperature. The change of state releases heat to ambient. In this manner, first terminal 43 and second terminal 45 may be maintained within a selected temperature range when vehicle 10 is charging.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A cooling system for an electric vehicle charge port comprising:
   a member having a base wall including an opening and a perimetrical wall extending from the base wall, the base wall and the perimetrical wall defining a volume;
   a heat spreader arranged in the volume;
   a terminal extending from the heat spreader through the opening in the base wall; and
   an amount of phase change material (PCM) arranged in the volume, the amount of PCM being in contact with the terminal,
   wherein the member is manufactured from an electrically-insulative heat-shrink material that contracts, when heated, to press its inner surface against the heat spreader and seal the PCM volume.

2. The cooling system for the electric vehicle charge port according to claim 1, wherein the heat spreader extends from the terminal to the perimetrical wall.

3. The cooling system for the electric vehicle charge port according to claim 1, wherein the heat spreader comprises a metallic foam.

4. The cooling system for the electric vehicle charge port according to claim 3, wherein the metallic foam is an open cell metallic foam.

5. The cooling system for the electric vehicle charge port according to claim 1, wherein the heat spreader includes a plurality of fins that project radially outwardly from the terminal.

6. The cooling system for the electric vehicle charge port according to claim 5, wherein the heat spreader includes a central support including a bore receptive of the terminal, the plurality of fins being formed with the central support.

7. The cooling system for the electric vehicle charge port according to claim 1, wherein the perimetrical wall is annular.

8. The cooling system for the electric vehicle charge port according to claim 1, wherein the base wall includes a first opening and a second opening, the member including a divider that extends between the first opening and the second opening dividing the volume into a first portion and a second portion.

9. The cooling system for the electric vehicle charge port according to claim 8, wherein the terminal includes a first terminal extending into the first portion of the volume through the first opening in the base wall and a second terminal extending into the second portion of the volume through the second opening in the base wall.

10. The cooling system for the electric vehicle charge port according to claim 1, wherein the member further comprises a cover formed from an electrically-insulative heat-shrink material, the cover being configured to seal against and/or around the member to prevent leakage of the phase change material (PCM).

11. The cooling system for the electric vehicle charge port according to claim 1, wherein the heat spreader comprises a central support having a bore receptive of the terminal, and a plurality of fins projecting radially outwardly from the central support, the inner surface of the member contacting each of the plurality of fins when contracted.

12. An electric vehicle comprising:
   a body;
   an electric motor arranged in the body;
   a battery pack electrically connected to the electric motor; and
   a charge port supported by the body and electrically connected to the battery pack, the charge port comprising:
   a member having a base wall including an opening and a perimetrical wall extending from the base wall, the base wall and the perimetrical wall defining a volume;
   a heat spreader arranged in the volume;
   a terminal extending from the heat spreader through the opening in the base wall; and
   an amount of phase change material (PCM) arranged in the volume, the amount of PCM being in contact with the terminal,
   wherein the member is manufactured from an electrically-insulative heat-shrink material that contracts, when heated, to press its inner surface against the heat spreader and seal the PCM volume.

13. The electric vehicle according to claim 12, wherein the heat spreader extends from the terminal to the perimetrical wall.

14. The electric vehicle according to claim 12, wherein the heat spreader comprises a metallic foam.

15. The electric vehicle according to claim 14, wherein the metallic foam is an open cell metallic foam.

16. The electric vehicle according to claim 12, wherein the heat spreader includes a plurality of fins that project radially outwardly from the terminal.

17. The electric vehicle according to claim 16, wherein the heat spreader includes a central support including a bore receptive of the terminal, the plurality of fins being formed with the central support.

18. The electric vehicle according to claim 12, wherein the perimetrical wall is annular.

19. The electric vehicle according to claim 12, wherein the base wall includes a first opening and a second opening, the member including a divider that extends between the first opening and the second opening dividing the volume into a first portion and a second portion.

20. The electric vehicle according to claim 19, wherein the terminal includes a first terminal extending into the first portion of the volume through the first opening in the base wall and a second terminal extending into the second portion of the volume through the second opening in the base wall.

\* \* \* \* \*